United States Patent
Tzu

(10) Patent No.: US 6,605,176 B2
(45) Date of Patent: Aug. 12, 2003

(54) APERTURE FOR LINEAR CONTROL OF VACUUM CHAMBER PRESSURE

(75) Inventor: Lin Kun Tzu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 180 days.

(21) Appl. No.: 09/904,808

(22) Filed: Jul. 13, 2001

(65) Prior Publication Data

US 2003/0010447 A1 Jan. 16, 2003

(51) Int. Cl.[7] .................. C23F 1/10; H01L 21/306; C23C 16/00
(52) U.S. Cl. .................. 156/345.26; 118/695; 118/715; 251/212
(58) Field of Search .................. 251/212; 118/695, 118/715; 156/345.26

(56) References Cited

U.S. PATENT DOCUMENTS

| | | | | |
|---|---|---|---|---|
| 4,026,321 A | * | 5/1977 | Kahoe et al. | 137/487 |
| 4,094,492 A | * | 6/1978 | Beeman et al. | 251/212 |
| 4,122,668 A | * | 10/1978 | Chou et al. | 60/792 |
| 4,389,229 A | * | 6/1983 | Jang et al. | 65/418 |
| 4,757,198 A | * | 7/1988 | Korte et al. | 250/288 |
| 5,002,928 A | * | 3/1991 | Fukui et al. | 505/401 |
| 5,070,813 A | * | 12/1991 | Sakai et al. | 118/695 |
| 5,358,740 A | * | 10/1994 | Bornside et al. | 427/240 |
| 5,678,595 A | * | 10/1997 | Iwabuchi | 137/341 |
| 5,743,457 A | * | 4/1998 | Benedette et al. | 228/33 |
| 6,156,152 A | * | 12/2000 | Ogino et al. | 156/345.42 |
| 6,197,150 B1 | * | 3/2001 | Kwag et al. | 156/345.23 |
| 6,315,858 B1 | * | 11/2001 | Shinozuka et al. | 156/345.33 |
| 6,418,874 B1 | * | 7/2002 | Cox et al. | 118/723 L |

* cited by examiner

Primary Examiner—Jeffrie R. Lund
Assistant Examiner—Rudy Zervigon
(74) Attorney, Agent, or Firm—Tung & Associates

(57) ABSTRACT

The linear controlling of the pressure of a vacuum chamber, such as a plasma etch chamber used in semiconductor processing, is disclosed. A plasma etch chamber pressure control mechanism includes an aperture diaphragm and a number of aperture blades rotatably mounted on the aperture diaphragm. The diaphragm defines a contractible and expandable aperture for controlling the pressure of the chamber. Rotation of the aperture blades in a first direction contracts the aperture by causing movement of the blades towards the aperture, increasing the pressure of the chamber. Rotation of the aperture blades in a second direction opposite to the first direction expands the aperture by causing movement of the blades away from the aperture, decreasing the pressure of the chamber.

9 Claims, 14 Drawing Sheets

APERTURE FOR LINEAR CONTROL OF VACUUM CHAMBER PRESSURE

FIELD OF THE INVENTION

This invention relates generally to vacuum chambers, such as dry etch plasma chambers used in semiconductor processing, and particularly to controlling the pressure of such chambers.

BACKGROUND OF THE INVENTION

There are four basic operations in semiconductor processing, layering, patterning, doping, and heat treatments. Layering is the operation used to add thin layers to the surface of a semiconductor wafer. Patterning is the series of steps that results in the removal of selected portions of the layers added in layering. Doping is the process that puts specific amounts of dopants in the wafer surface through openings in the surface layers. Finally, heat treatments are the operations in which the wafer is heated and cooled to achieve specific results, where no additional material is added or removed from the wafer.

Of these four basic operations, patterning is typically the most critical. The patterning operation creates the surface parts of the devices that make up a circuit on the semiconductor wafer. The operation sets the critical dimensions of these devices. Errors during patterning can cause distorted or misplaced defects that result in changes in the electrical function of the device, as well as device defects.

The patterning process is also known by the terms photomasking, masking, photolithography, and microlithography. The process is a multi-step process similar to photography or stenciling. The required pattern is first formed in photomasks and transferred into the surface layers of the semiconductor wafer. This is shown by reference to FIGS. 1A and 1B. In FIG. 1A, the wafer 100 has an oxide layer 102 and a photoresist layer 104. A mask 106 is precisely aligned over the wafer 100, and the photoresist 104 is exposed, as indicated by the arrows 108. This causes the exposure of the photoresist layer 104, except for the part 110 that was masked by the part 112 of the mask 106. In FIG. 1B, the unexposed part 110 of the photoresist layer 104 is removed, creating a hole 114 in the photoresist layer 104.

Next, a second transfer takes place from the photoresist layer 104 into the oxide layer 102. This is shown in FIG. 1C, where the hole 114 extends through both the photoresist layer 104 and the oxide layer 102. The transfer occurs when etchants remove the portion of the wafer's top layer that is not covered by photoresist. The chemistry of photoresists is such that they do not dissolve, or dissolve very slowly, in the chemical etching solutions. Finally, the photoresist layer 104 is removed, as shown in FIG. 1D, such that only the wafer 100 and the oxide layer 102 with the hole 114 remains.

The removal of the photoresist layer can be accomplished by either wet or dry etching. Wet etching refers to the use of wet chemical processing to remove the photoresist. The chemicals are placed on the surface of the wafer, or the wafer itself is submerged in the chemicals. Dry etching refers to the use of plasma stripping, using a gas such as oxygen ($O_2$), $C_2F_6$ and $O_2$, or another gas. Whereas wet etching is a low-temperature process, dry etching is typically a high-temperature process.

One type of dry etching process is shown in FIG. 2. Within the chamber 200, a semiconductor wafer 202 sits on a number of pins 208, 210, and 212, such that the wafer rests against a heater block 216. This position of the wafer 202 resting against the block 216 is referred to as the pin down position. Gas is introduced at insertion point 206, where the showerhead 204 sprays the gas onto the plasma 218, which is situated within the grounded grid 214. The plasma 218 energizes the gas to a high-energy state, which in turn oxidizes the resist components to gases that are removed from the chamber 200 by a vacuum pump (not shown in FIG. 2). Dry etching is advantageous to wet etching for resist stripping because it eliminates the use of wet hoods and the handling of chemicals.

For the dry etch process to work properly, the pressure within the chamber must be able to be controlled in a precise manner. However, existing pressure control mechanisms are less than desirable. They make it difficult to control chamber pressure in a linear manner. Furthermore, their machine parts are heavy, taking up great amounts of space, and move slowly, rendering pressure control a slow process, particularly to stabilize the pressure at a desired level.

FIG. 3 shows one type of existing plasma chamber pressure control mechanism 300, which utilizes a throttle valve design. The pressure chamber 304 opens to a cavity 302 through an opening 314, in which a tapered valve 306 is situated. The tapered valve 306 is connected to a rod 308. Vertical movement of the rod 308, as indicated by the arrow 310, is possible through a controller 312. Such vertical movement causes the valve 306 to expose more or less of the opening 314, allowing control of the pressure in the chamber 304.

For example, where the valve 306 is positioned higher within the chamber 304, more of the opening 314 is exposed, causing lower chamber pressure. This is shown in the vertical view of FIG. 4A, where the valve 306 occupies less of the opening 314, exposing a larger part of the opening 314, as indicated by the reference number 402. However, where the valve 306 is positioned lower within the chamber 304, less of the opening 314 is exposed, causing higher chamber pressure. This is shown in the vertical view of FIG. 4B, where the valve 306 occupies more of the opening 314, exposing a smaller part of the opening 314, as indicated by the reference number 404.

FIG. 5 shows another type of existing plasma chamber pressure control mechanism 500, which also utilizes a throttle valve design. The pressure chamber 504 opens to a cavity 502 through an opening defined between the spacers 508 and 510, in which a valve 506 is situated. Vertical movement of the valve 506 causes the valve 506 to expose more or less of the opening defined between the spacers 508 and 510, allowing control of the pressure in the chamber 504.

For example, where the valve 506 is positioned higher within the cavity 502, more of the opening is exposed, causing lower chamber pressure. This is shown in the vertical view of FIG. 6A, where a relatively large part of the opening, indicated by the reference numbers 602 and 604, is exposed. However, where the valve 506 is positioned lower within the cavity 502, less of the opening is exposed, causing higher chamber pressure. This is shown in the vertical view of FIG. 6B, where a relatively small part of the opening, indicated by the reference numbers 606 and 608, is exposed.

FIG. 7 shows an exploded view of a final type of existing plasma chamber pressure control mechanism 700, which utilizes a pendular valve design. The pressure chamber 712 has an opening 714, which is concentrically positioned along the vertical axis 702 over the opening 706 of the top flange 704. The pendular valve 708 has an opening 710 that allows access of the opening 714 of the chamber 712 to the opening 706 of the flange 704 when the opening 710 is concentrically aligned over the openings 714 and 706. However, the valve 708 is rotatable along the vertical axis 718, as indicated by the arrow 716, such that more or less of the opening 710 can be exposed, meaning that more or less of the opening 714 of the chamber 712 is allowed access to the opening 706 of the top flange 704.

For example, where the opening 710 of the valve 708 is positioned relatively more concentrically over the opening 714 of the chamber 712, more of the opening 706 of the flange 704 is exposed, causing lower chamber pressure. This is shown in the vertical view of FIG. 8A, where the opening 710 is relatively more concentrically positioned over the opening 714, causing a relatively large access area 802 to the opening 706 (not shown in FIG. 8A), for lower chamber pressure. The large access area 802 is the area of overlap, or intersection, between the openings 710 and 714.

However, where the opening 710 of the valve 708 is positioned relatively less concentrically over the opening 714 of the chamber 712, less of the opening 706 of the flange 704 is exposed, causing higher chamber pressure. This is shown in the vertical view of FIG. 8B, where the opening 710 is relatively less concentrically positioned over the opening 714, causing a relative small access area 804 to the opening 706 (not shown in FIG. 8A), for higher chamber pressure. The small access area 804 is the area of overlap, or intersection, between the openings 710 and 714.

The plasma chamber pressure control mechanisms of FIGS. 3, 5, and 7 that have been described exhibit the mentioned disadvantages of existing chamber pressure control mechanisms. Therefore, there is a need to control chamber pressure in a linear manner. There is also a need for a pressure control mechanism that does not require a heavy valve and associated machinery, such that the mechanism does not use a large amount of space. Finally, there is a need for a pressure control mechanism that moves relatively quickly, rendering pressure control a faster process, particularly to stabilize the pressure at a desired level. For these and other reasons, there is a need for the present invention.

SUMMARY OF THE INVENTION

Linearly controlling the pressure of a vacuum chamber, such as a plasma etch chamber used in semiconductor processing, is disclosed. A plasma etch chamber pressure control mechanism of the invention includes an aperture diaphragm and a number of aperture blades rotatably mounted on the aperture diaphragm. The diaphragm defines a contractible and expandable aperture for controlling the pressure of the chamber. Rotation of the aperture blades in a first direction, such as counter-clockwise, contracts the aperture, increasing the pressure of the chamber. Rotation of the aperture blades in a second direction opposite to the first direction, such as clockwise, expands the aperture, decreasing the pressure of the chamber.

The mechanism can also include two rotatable circular frames. The first frame is around the aperture diaphragm and has a number of inward facing gear teeth. Gear teeth of circular gears corresponding to the aperture blades, and rotatably mounting the blades to the diaphragm, interlock with the inward-facing gear teeth of the first frame. Rotation of the frame in the first direction causes the rotation of the blades in the first direction, and vice-versa. The first frame preferably insulates the aperture diaphragm and the aperture blades in an airtight manner.

The second frame is around the first frame, and interacts with the first frame to cause the rotation of the first frame indirectly in the direction that the second frame is directly rotated. Both frames may include magnets substantially equally spaced around them, where each magnet of the second frame has a polarity opposite to that of a corresponding magnet of the first frame. Directly rotating the second frame causes indirect rotation of the first frame through interaction among the magnets of the second frame with magnets of the first frame. A motor may be used to directly rotate the second frame.

The invention provides for advantages not found within the prior art. Plasma chamber pressure may be controlled linearly, because the aperture may be expanded and contracted linearly. In the embodiment where there are two frames, the outer frame is directly controlled with a motor, such that the motor and the frames do not require a large amount of space. The aperture may also be quickly contracted and expanded, stabilizing the chamber pressure at a desired level faster than in the prior art. Still other advantages, aspects, and embodiments of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
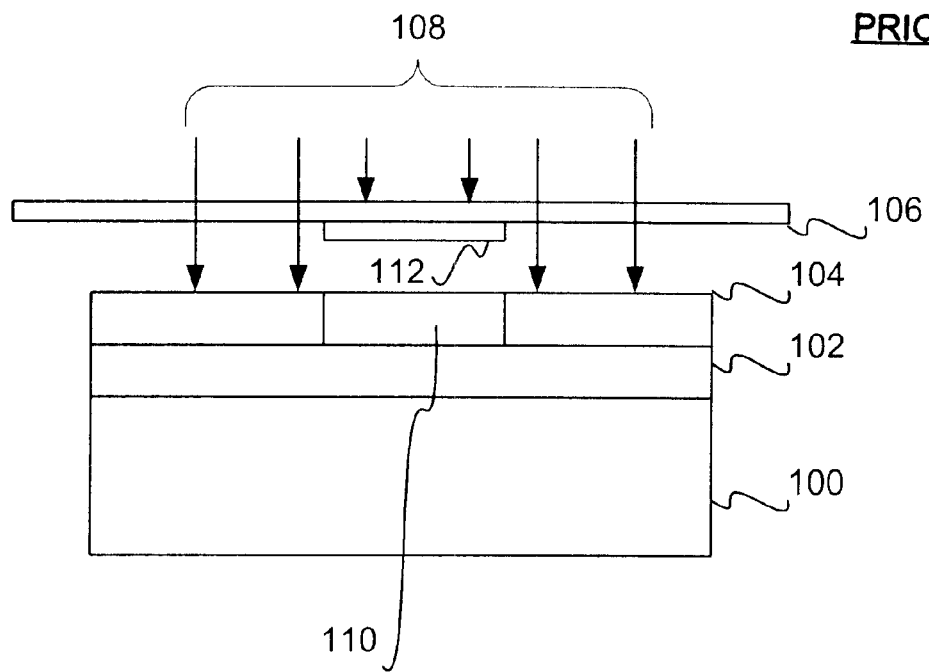
FIGS. 1A, 1B, 1C, and 1D are diagrams illustrating the general patterning process performed in semiconductor manufacture.
Figure 1B:
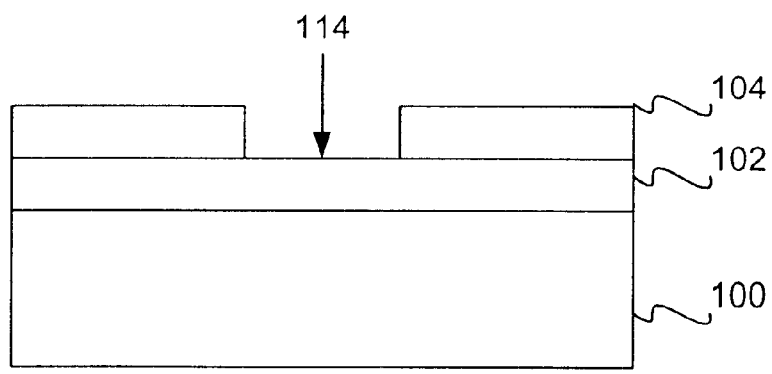
Figure 1C:
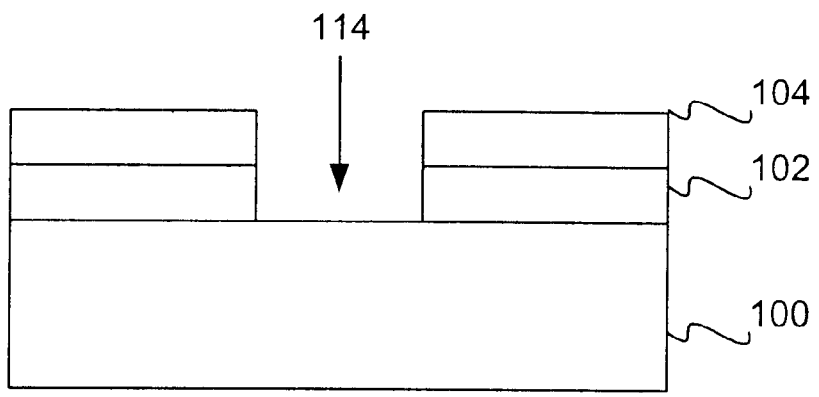
Figure 1D:
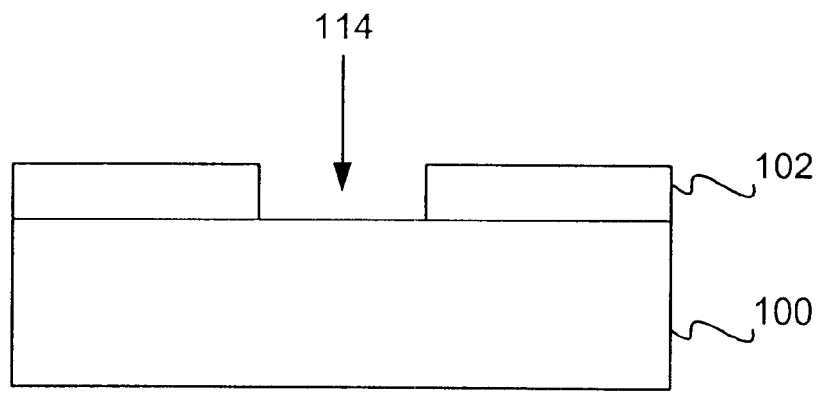
Figure 2:
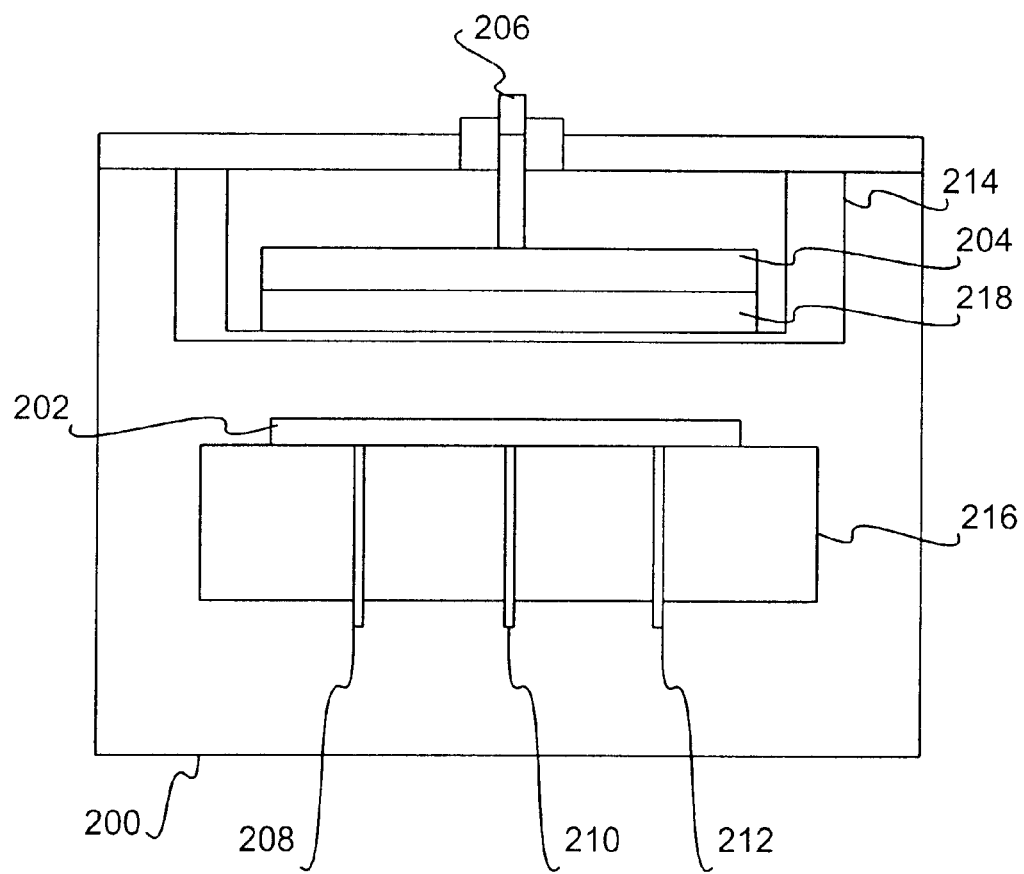
FIG. 2 is a diagram of a typical plasma etch chamber.
Figure 3:
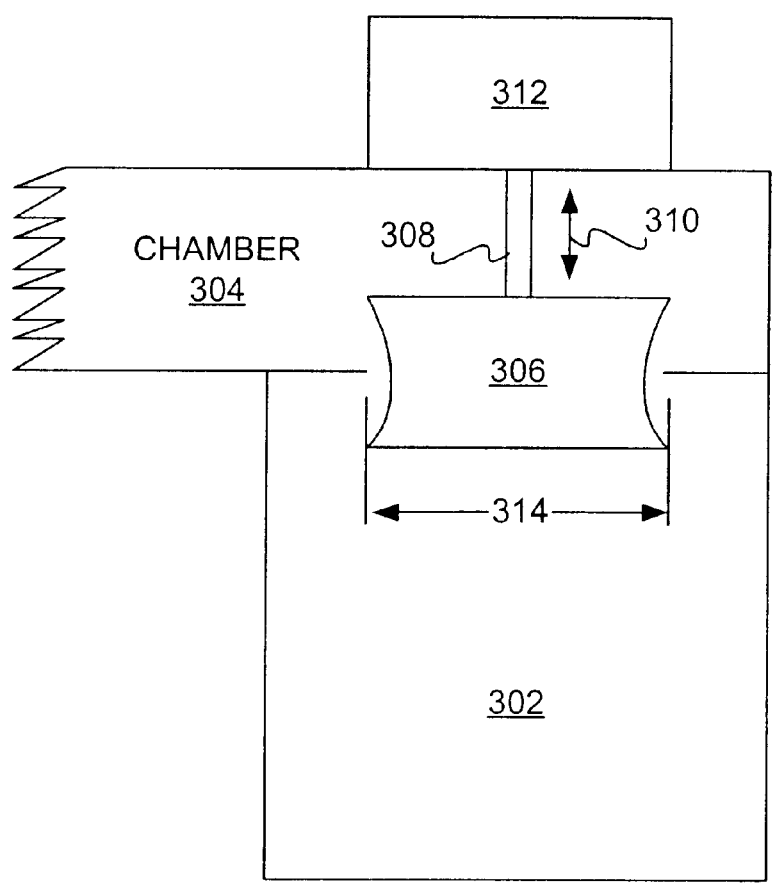
FIG. 3 is a diagram of an existing plasma chamber pressure control mechanism, utilizing a throttle valve design.
Figure 3:
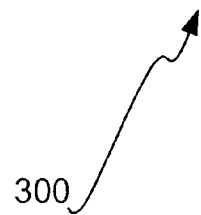
Figure 4A:
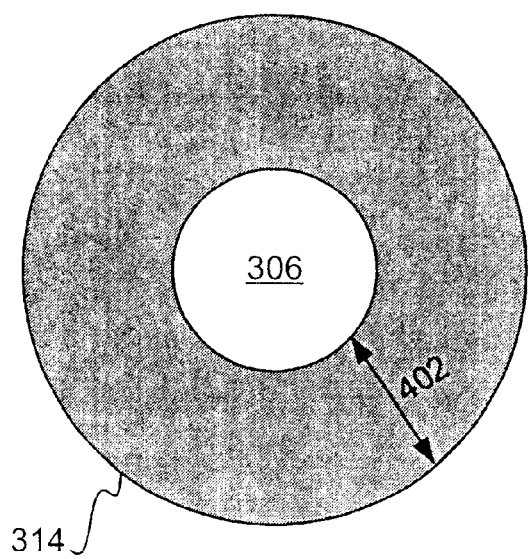
FIGS. 4A and 4B are diagrams showing how the pressure of the chamber of FIG. 3 is changed by controlling the opening between the chamber and a cavity.
Figure 4B:
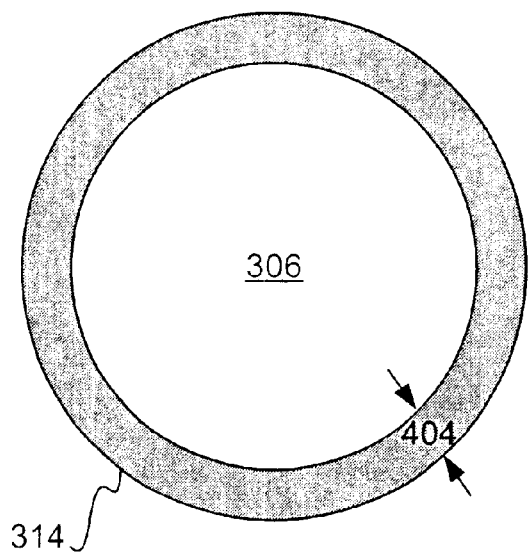
Figure 5:
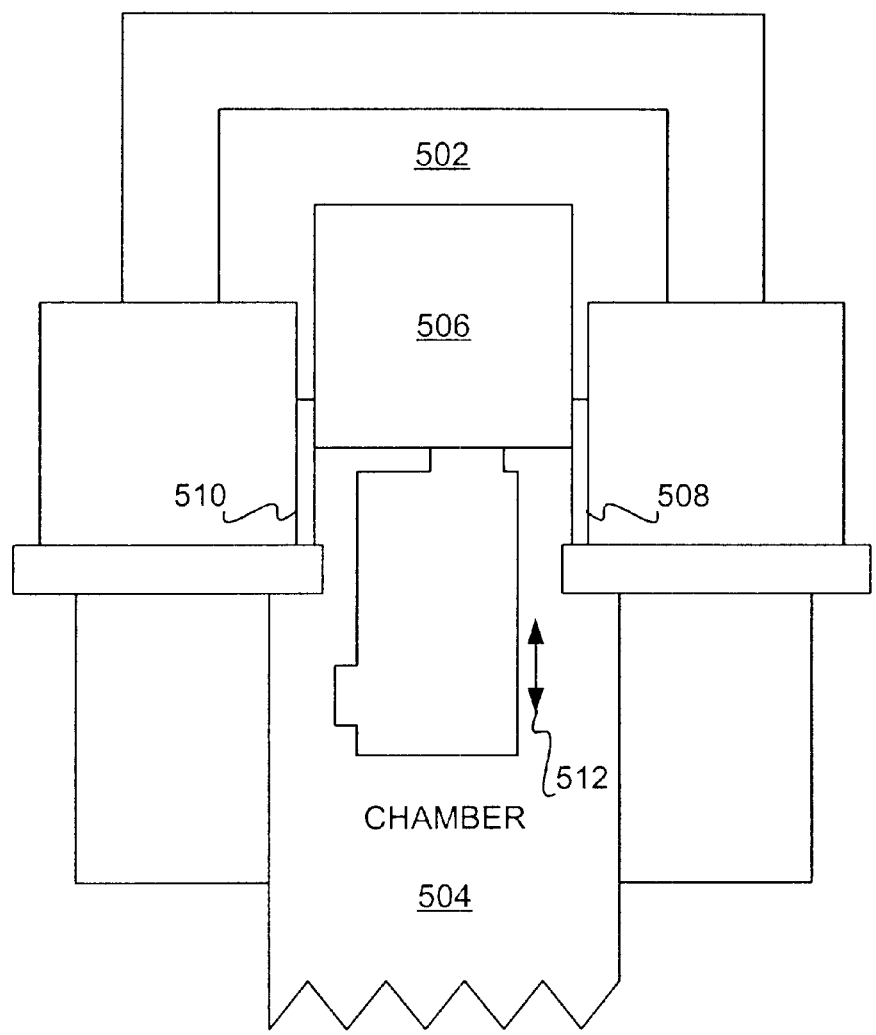
FIG. 5 is a diagram of another existing plasma chamber pressure control mechanism, also utilizing a throttle valve design.
Figure 5:
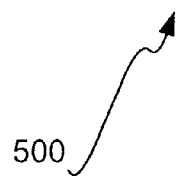
Figure 6A:
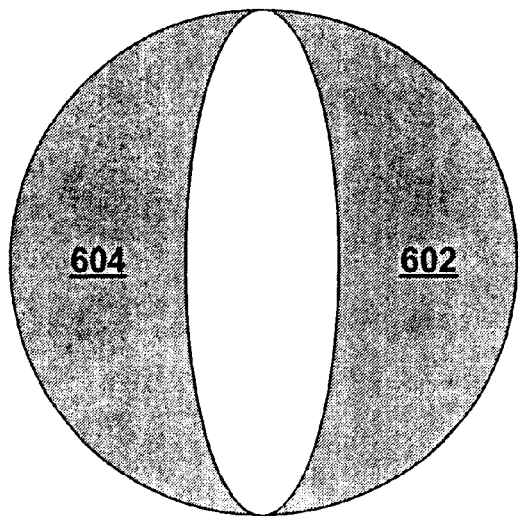
FIGS. 6A and 6B are diagrams showing how the pressure of the chamber of FIG. 5 is changed by controlling the opening between the chamber and a cavity.
Figure 6B:
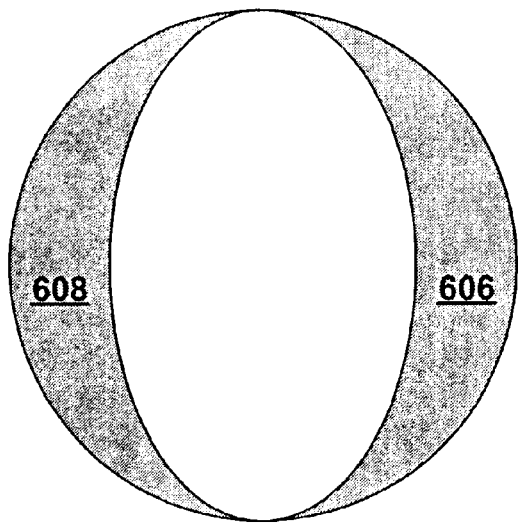
Figure 7:
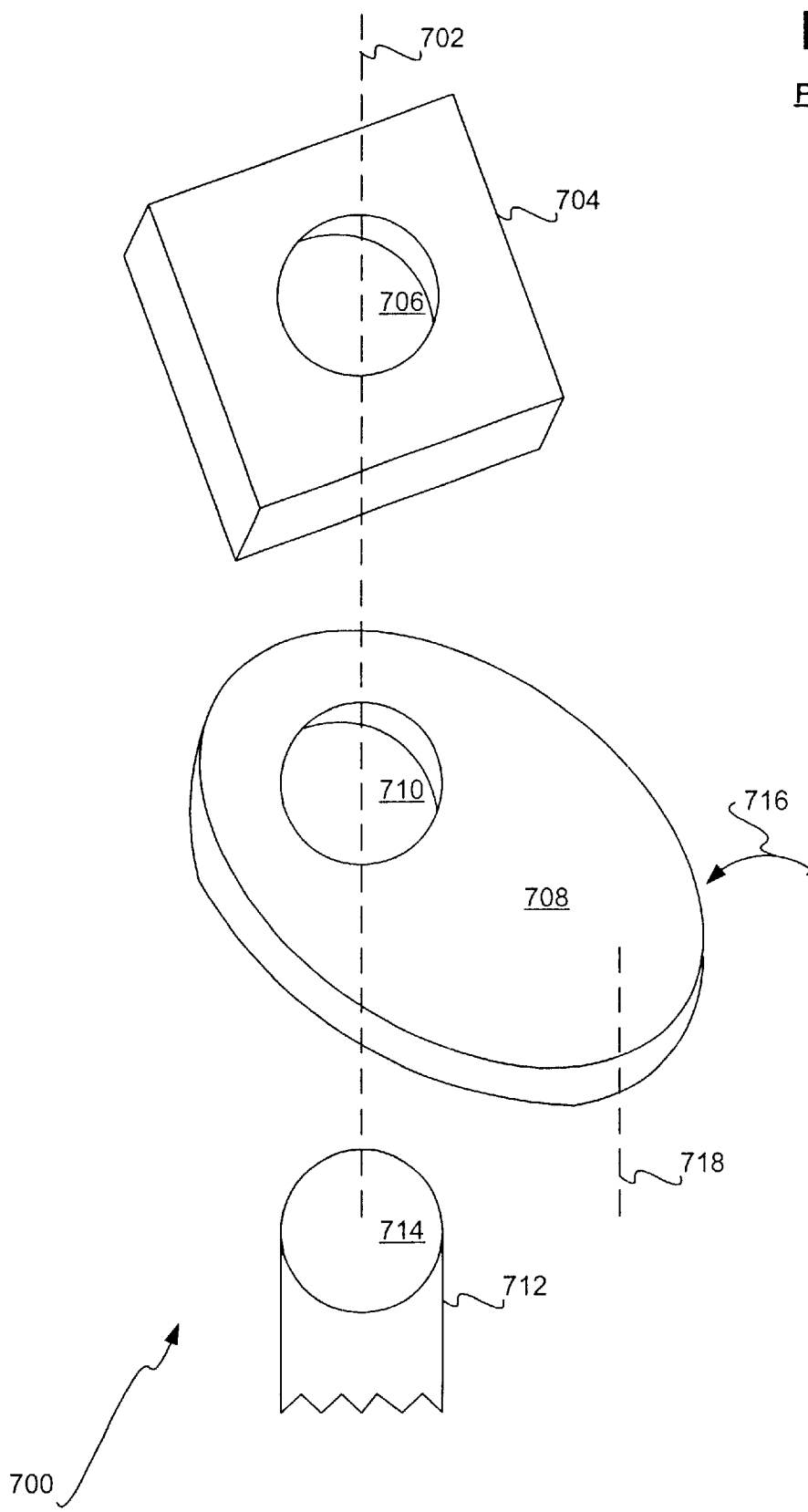
FIG. 7 is a diagram of another existing plasma chamber pressure control mechanism, utilizing a pendular valve design.
Figure 8A:
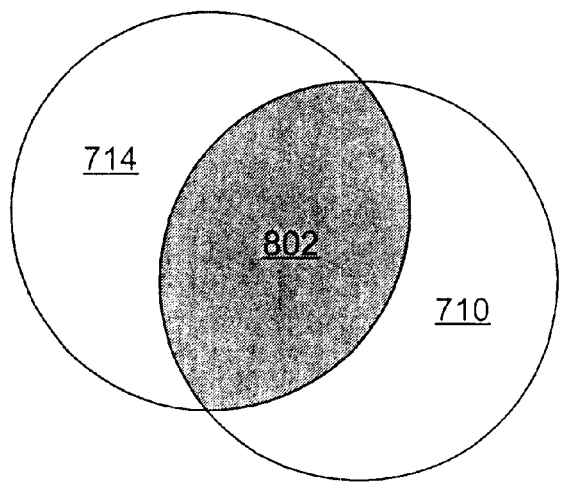
FIGS. 8A and 8B are diagrams showing how the pressure of the chamber of FIG. 7 is changed by controlling the opening to the chamber.
Figure 8B:
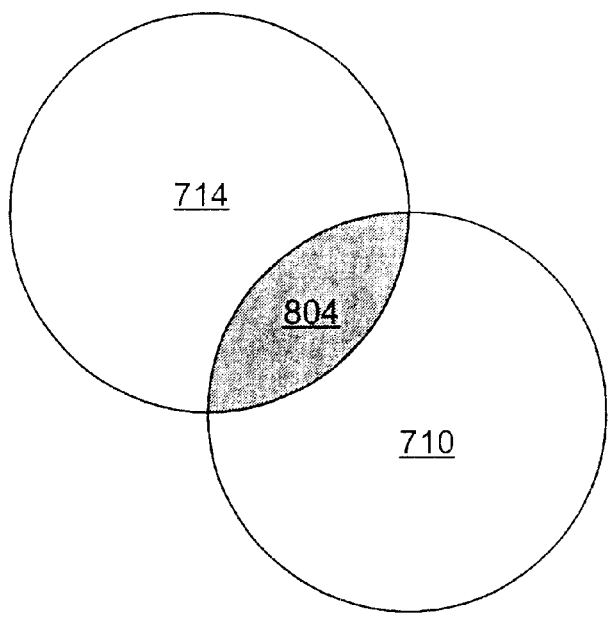
Figure 9:
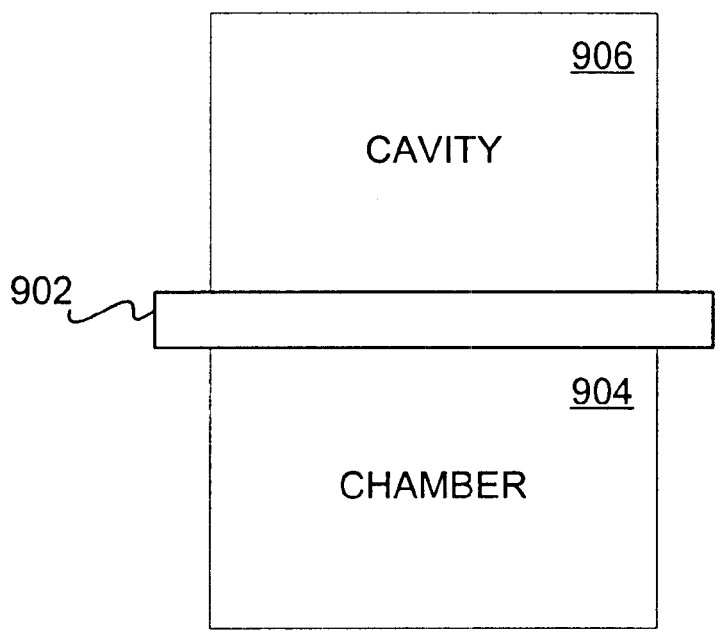
FIG. 9 is a diagram of a simplified plasma etch system, shown only as an example of an etch system that can be used in conjunction with the invention.
Figure 9:
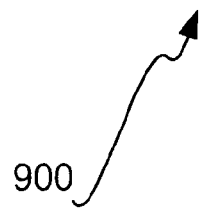

FIG. 9 shows a simplified plasma etch system 900, only as an example of an etch system that can be used in conjunction with the invention. Other types of etch systems are also amenable to the invention, however. Semiconductor wafers are placed in the plasma chamber 904, for etching purposes. A mechanism 902 separates the chamber 904 from a cavity 906. The mechanism 902 is for linearly controlling the pressure within the plasma chamber 904, as may be required for proper etching. The mechanism 902 in particular has a changeable opening there within for controlling the access of the chamber 904 to the cavity 906, which governs the pressure within the chamber 904. The cavity 906 is optional, however, and not required.

Figure 10A:
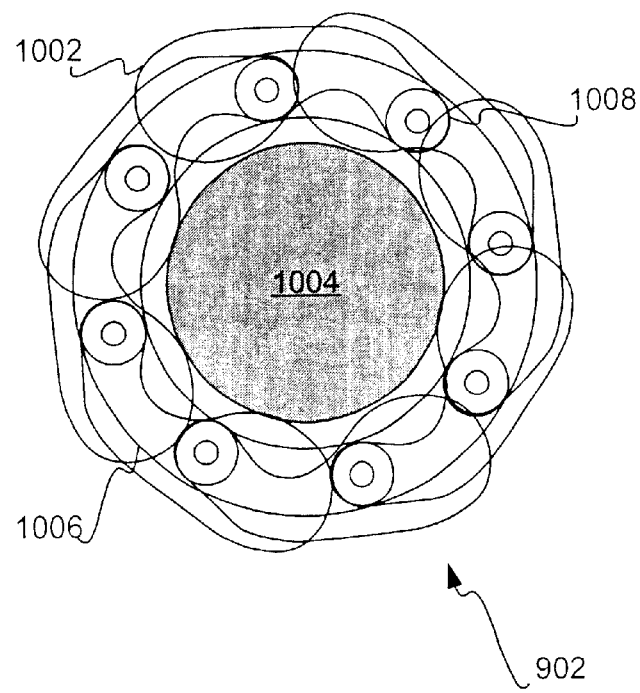
FIGS. 10A and 10B are diagrams showing how the pressure of the chamber of FIG. 9 is changed by controlling the opening to the chamber via aperture blades.
Figure 10B:
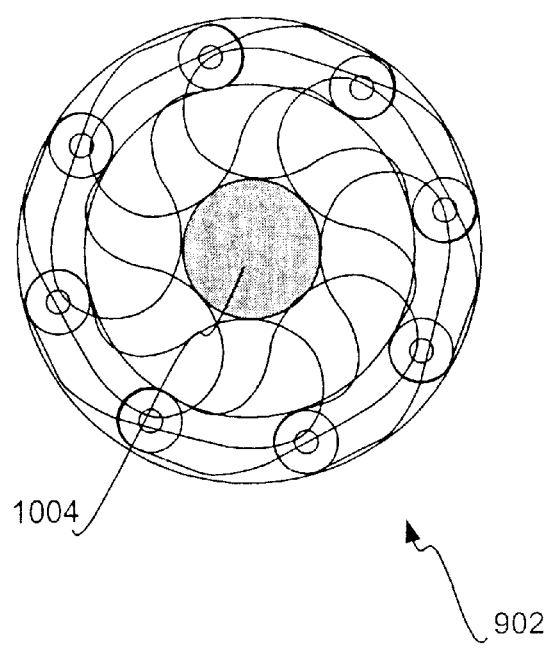

The mechanism 902 in the invention includes an aperture diaphragm and a number of aperture blades. The aperture blades are rotatable, so that the aperture defined by the diaphragm is expandable and contractible, to lower and raise, respectively, the pressure of the chamber 904. FIG. 10A shows the aperture 1004 of the mechanism 902 in a fully expanded position. There are a number of aperture blades, such as the aperture blade 1002, rotatably mounted to the aperture diaphragm 1006 via members, such as the member 1008. Each blade is rotatable in a counter-clockwise direction to reduce, or contract, the size of the aperture 1004, and a clockwise direction to enlarge, or expand, the size of the aperture 1006. FIG. 10B, by comparison, shows the aperture 1004 of the mechanism 902 in a more contracted position.

Thus, by rotating the blades in either a clockwise or a counter-clockwise direction, the pressure of the chamber 904 (not shown in FIGS. 10A and 10B) is decreased or increased, respectively. There may be more or less aperture blades than shown in FIGS. 10A and 10B. The blades are also quickly and easily moved (rotated), and allow for precise control of the size of the aperture 1004. This in turn allows precise control of the pressure of the chamber 904.

Figure 11:
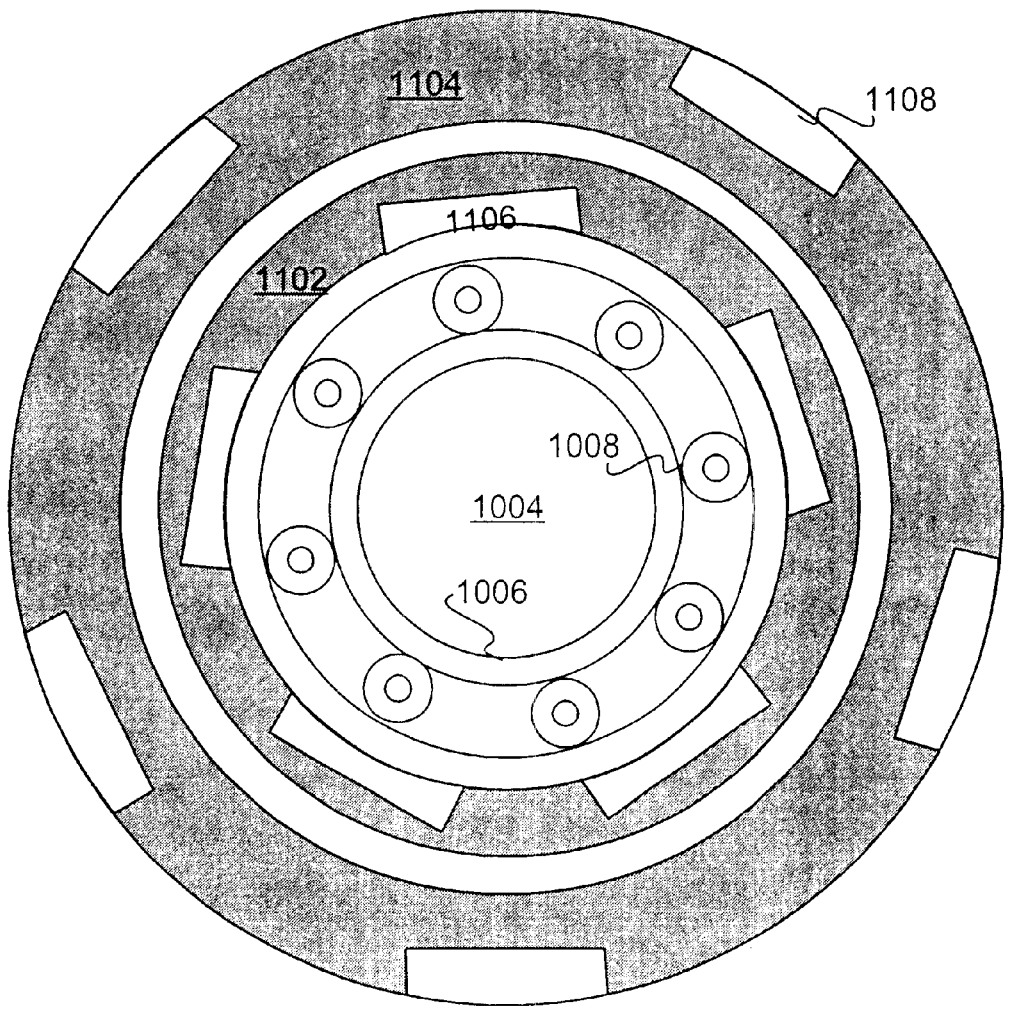
FIG. 11 is a diagram showing a specific embodiment of a plasma etch chamber pressure control mechanism, without the aperture blades for illustrative clarity.
Figure 11:

FIG. 11 shows a specific embodiment of the mechanism 902. The aperture blades are not shown in FIG. 11 for purposes of illustrative clarity only. The aperture diaphragm 1006 surrounds the aperture 1004, and has immovably mounted thereto the members by which the aperture blades are rotatably mounted to the diaphragm 1006, such as the member 1008. An inner rotatable circular frame 1102 surrounds the diaphragm 1006. The frame 1102 has two purposes. First, it seals the diaphragm 1006 and the aperture blades in an airtight manner, so that the pressure within the chamber 904 (not shown in FIG. 11) can be stabilized. Second, the frame 1102, by its own rotation, causes the aperture blades to rotate, as will be shown and described.

The inner frame 1102 has a number of magnets, such as the magnet 1106, situated there around in a substantially equally spaced configuration. An outer rotatable circular frame 1104 surrounds the inner frame 1102. The outer frame 1104 also has a number of magnets, such as the magnet 1108, situated there around in a substantially equally spaced configuration. There are preferably the same number of magnets in the outer frame 1104 as there are in the inner frame 1102, and each magnet in the former frame corresponds to a magnet in the latter frame. For instance, the magnet 1108 of the outer frame 1104 corresponds to the magnet 1106 of the inner frame 1102. There may be more or less magnets than the number shown in FIG. 11.

Rotation of the outer frame 1104 causes rotation of the inner frame 1102, due to the interaction of the former with the latter. More specifically, the magnets of the outer frame 1104 interact with the magnets of the inner frame 1102 for rotation of the former frame to cause rotation of the latter frame. This is done by oppositely configuring corresponding magnets of the frames 1102 and 1104 so that the north pole of each magnet in the outer frame 1104 aligns with the south pole of its corresponding magnet in the inner frame 1102, and vice-versa. In this way, rotation of the outer frame 1104 causes rotation of the inner frame 1102 in the same direction, because the magnets of the former frame are magnetically locked to the corresponding magnets of the latter frame.

Figure 12:
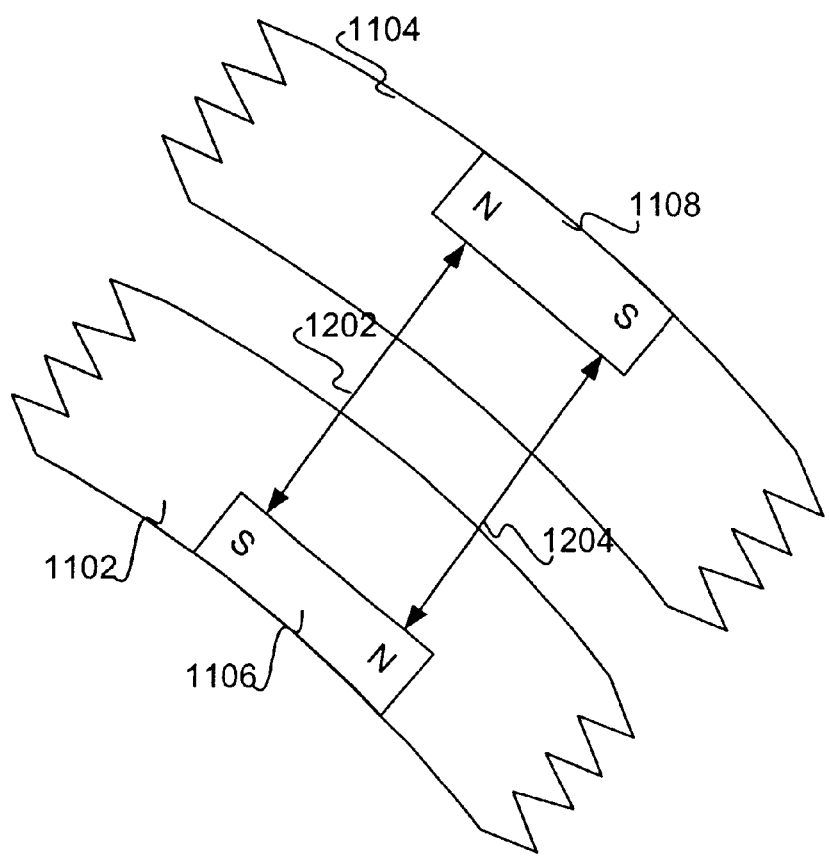
FIG. 12 is a diagram showing the magnets of the outer frame of the mechanism of FIG. 11 interact with the magnets of the inner frame of the mechanism of FIG. 11, such that direct rotation of the former frame indirectly causes rotation of the latter frame in the same direction.

This is shown in more detail in FIG. 12. The magnet 1108 of the outer frame 1104 has its north pole directly aligned with the south pole of the magnet 1106 of the inner frame 1102, as indicated by the line 1202. Similarly, the south pole of the magnet 1108 is directly aligned with the north pole of the magnet 1106, as indicated by the line 1204. Direct rotation, or movement, of the outer frame 1104 thus indirectly causes corresponding rotation, or movement, of the inner frame 1102. Rotation of the outer frame 1104 may be by a motor, not shown in FIG. 12. The motor, along with the mechanism 902 itself (not shown in FIG. 12), take up substantially less space than the plasma chamber pressure control mechanisms of the prior art.

Figure 13:
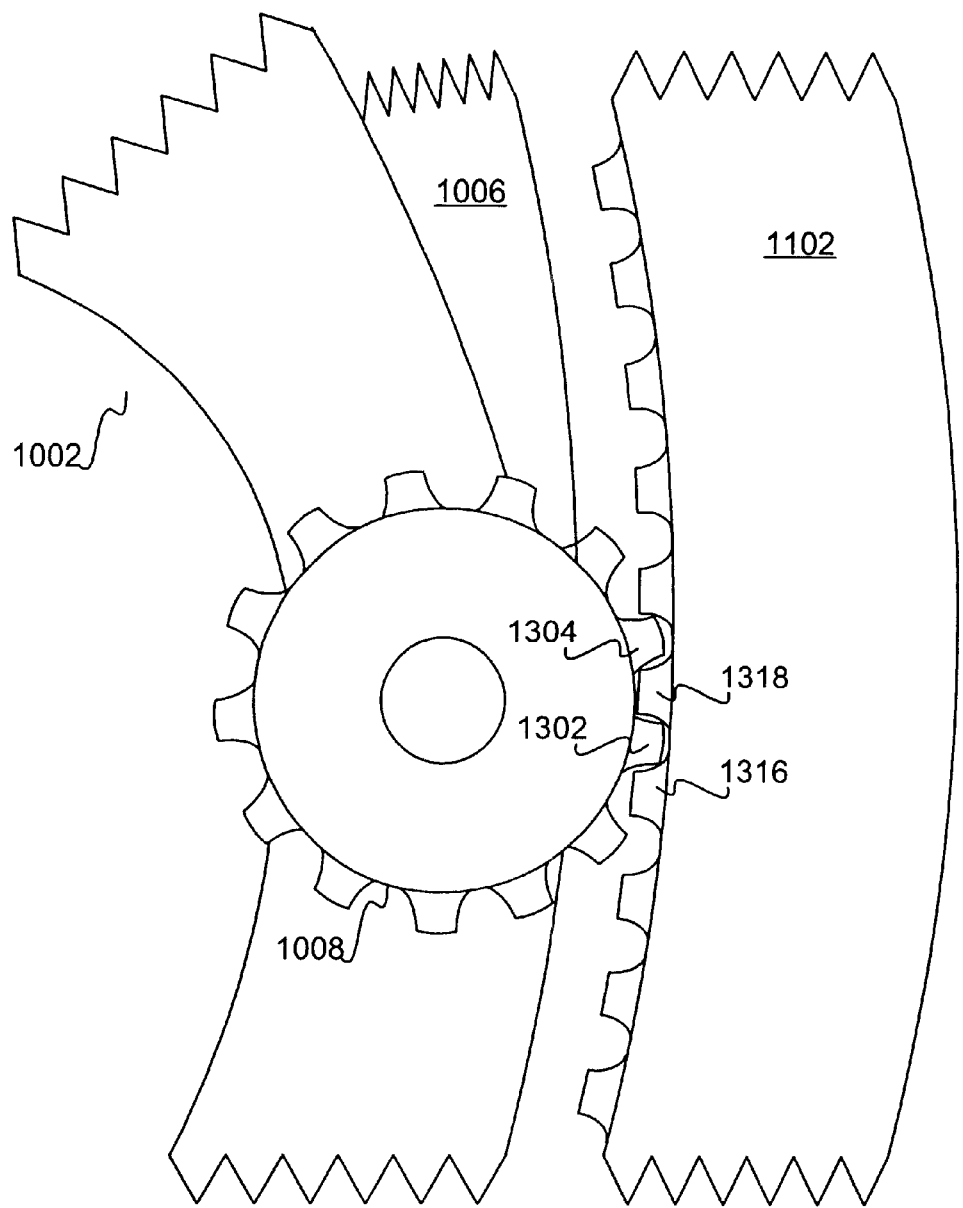
FIG. 13 is a diagram showing how rotation of the inner frame of the mechanism of FIG. 11 causes rotation of the aperture blades, via interlocking gear teeth of the former and the latter, such that the aperture is expanded and contracted.

The manner by which the rotation of the inner frame 1102, resulting from the direct rotation of the outer frame 1104, causes rotation of the aperture blades is shown in FIG. 13. The inner frame 1102 has a number of inward facing gear teeth, such as the inward facing gear teeth 1306 and 1308. The members of the aperture blades, such as the member 1008 for the aperture blade 1002, are gears in the embodiment of FIG. 13, having gear teeth, such as the gear teeth 1302 and 1034. The gear teeth of the blade members interlock with the inward facing gear teeth of the inner frame 1102. Therefore, when the inner frame 1102 is rotated in one direction, the blade members and the aperture blades rotate in the same direction.

For instance, when the inner frame 1102 rotates clockwise, because of the inward facing gear teeth of the frame 1102 interlocking with the gear teeth of the member 1008, the member 1008 also rotates clockwise. Because the aperture blade 1002 is mounted to the member 1008, it, too, rotates clockwise. Similarly, when the inner frame 1102 rotates counter-clockwise, the aperture blade 1002 rotates counter-clockwise. The aperture blade 1002 is immovably part of or affixed to the member 1008, whereas the member 1008 rotatably mounts the blade 1002 to the aperture diaphragm 1006.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For instance, the invention is applicable to vacuum chambers other than plasma etch chambers. Therefore, it is manifestly intended that this invention be limited only by the claims and equivalents thereof.

What is claimed is:

1. A mechanism for linearly controlling pressure of a vacuum chamber comprising: an aperture diaphragm defining a contractible and expandable aperture for controlling the pressure of the vacuum chamber;

a plurality of aperture blades rotatably mounted on the aperture diaphragm, such that rotation of the plurality of aperture blades in a first direction contracts the aperture, increasing the pressure of the vacuum chamber, and such that the rotation of the plurality of aperture blades in a second direction opposite to the first direction expands the aperture, decreasing the pressure of the vacuum chamber; and a rotatable circular frame around the aperture diaphragm having a plurality of inward-facing gear teeth, wherein each aperture blade is rotatably mounted to the aperture diaphragm by a circular gear having a number of gear teeth there around that interlock with the inward-facing gear teeth of the frame, such that rotation of the frame in the first direction causes the rotation of the plurality of aperture blades in the first direction, and such that the rotation of the frame in the second direction causes the rotation of the plurality of aperture blades in the second direction, said rotatable circular frame comprises a plurality of magnets situated there around in a substantially equally spaced configuration, such that application of a magnetic field around the frame causes rotation of the frame.

2. The mechanism of claim 1, wherein the rotatable circular frame insulates the aperture diaphragm and the plurality of aperture blades in an airtight manner.

3. The mechanism of claim 1, further comprising a second rotatable circular frame that interacts with the rotatable circular frame to cause the rotation of the frame indirectly in the first direction upon direct rotation of the second frame in the first direction, and the rotation of the frame indirectly in the second direction upon the direct rotation of the second frame in the second direction.

4. The mechanism of claim 3, wherein both the rotatable circular frame and the second rotatable circular frame comprise a plurality of magnets situated there around in a substantially equally spaced configuration, each magnet of the second frame having a polarity opposite to that of a corresponding magnet of the frame, such that the plurality of magnets of the second frame upon the direct rotation of the second frame causes the indirection rotation of the frame in a same direction through interaction with the plurality of magnets of the frame.

5. The mechanism of claim 3, further comprising a motor to directly rotate the second rotatable circular frame, and indirectly rotate the rotatable circular frame.

6. A mechanism for linearly controlling pressure of a vacuum chamber comprising: an aperture diaphragm defining a contractible and expandable aperture for controlling the pressure of the vacuum chamber; a plurality of aperture blades, where rotation of the plurality of aperture blades in a first direction contracts the aperture, increasing the pressure of the vacuum chamber, and where the rotation of the plurality of aperture blades in a second direction opposite to the first direction expands the aperture, decreasing the pressure of the vacuum chamber; a rotatable circular frame around the aperture diaphragm having a plurality of inward-facing gear teeth, said rotatable circular frame insulates the aperture diaphragm and the plurality of aperture blades in an airtight manner; and, a plurality of circular gears corresponding to the plurality of aperture blades and rotatably mounting the plurality of aperture blades to the aperture diaphragm, the plurality of circular gears interlocking with the inward-facing gear teeth of the frame, such that rotation of the frame in the first direction causes the rotation of the plurality of aperture blades in the first direction, and such that the rotation of the frame in the second direction causes the rotation of the plurality of aperture blades in the second direction.

7. The mechanism of claim 6, further comprising a second rotatable circular frame that interacts with the rotatable circular frame to cause the rotation of the frame indirectly in the first direction upon direct rotation of the second frame in the first direction, and the rotation of the frame indirectly in the second direction upon the direction rotation of the second frame in the second direction.

8. The mechanism of claim 6, wherein both the rotatable circular frame and the second rotatable circular frame comprise a plurality of magnets situated there around in a substantially equally spaced configuration, each magnet of the second frame having a polarity opposite to that of a corresponding magnet of the frame, such that the plurality of magnets of the second frame upon the direct rotation of the second frame causes the indirection rotation of the frame in a same direction through interaction with the plurality of magnets of the frame.

9. The mechanism of claim 8, further comprising a motor to directly rotate the second rotatable circular frame, and indirectly rotate the rotatable circular frame.

* * * * *